United States Patent
Fan et al.

(10) Patent No.: US 11,765,960 B2
(45) Date of Patent: Sep. 19, 2023

(54) DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Cong Fan, Beijing (CN); Fan He, Beijing (CN); Kemeng Tong, Beijing (CN); Xiangdan Dong, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/787,591

(22) PCT Filed: Jun. 18, 2021

(86) PCT No.: PCT/CN2021/100997
§ 371 (c)(1),
(2) Date: Jun. 21, 2022

(87) PCT Pub. No.: WO2022/022155
PCT Pub. Date: Feb. 3, 2022

(65) Prior Publication Data
US 2022/0416201 A1    Dec. 29, 2022

(30) Foreign Application Priority Data

Jul. 31, 2020    (CN) .......................... 202010759902.9

(51) Int. Cl.
*H10K 59/80*    (2023.01)
*G06F 3/041*    (2006.01)
(Continued)

(52) U.S. Cl.
CPC ....... *H10K 59/8731* (2023.02); *G06F 3/0412* (2013.01); *H10K 50/844* (2023.02);
(Continued)

(58) Field of Classification Search
CPC .... H10K 59/873; H10K 50/844; H10K 59/40; H10K 59/00–95; G06F 3/04164;
(Continued)

(56) References Cited

U.S. PATENT DOCUMENTS 9,785,005 B2    10/2017    Yeh et al.
10,135,020 B1    11/2018    Zhang et al.
(Continued)

FOREIGN PATENT DOCUMENTS

CN    107180852 A    9/2017
CN    107393906 A    11/2017
(Continued)

OTHER PUBLICATIONS

International Search Report dated Sep. 18, 2021 in International Application No. PCT/CN2021/100997, 4 pages.
(Continued)

*Primary Examiner* — Sanjiv D. Patel
(74) *Attorney, Agent, or Firm* — XSENSUS LLP

(57) ABSTRACT

Disclosed are a display panel and a display device. The display panel comprises a driving backboard, a touch-control layer, a first inorganic layer and a first organic layer, wherein the driving backboard is provided with a display area and a peripheral area surrounding the display area, the peripheral area comprising a binding area; the touch-control layer comprises a first touch-control electrode layer, an insulating layer and a second touch-control electrode layer; the first inorganic layer and the first organic layer are arranged in the binding area, the first inorganic layer and the insulating layer of the touch-control layer are arranged on
(Continued)

the same layer, the first organic layer and an organic layer of the display area are arranged on the same layer, the first organic layer is located on one side of the first inorganic layer that is away from the display area.

20 Claims, 6 Drawing Sheets

(51) Int. Cl.
*H10K 50/844* (2023.01)
*H10K 59/40* (2023.01)
*G06F 3/044* (2006.01)
*H10K 59/88* (2023.01)
*H10K 59/122* (2023.01)

(52) U.S. Cl.
CPC .......... *H10K 59/40* (2023.02); *H10K 59/873* (2023.02); *G06F 3/0445* (2019.05); *H10K 59/122* (2023.02); *H10K 59/88* (2023.02)

(58) Field of Classification Search
CPC .......... G06F 3/0445; G06F 3/041–047; G06F 2203/041–04114
See application file for complete search history.

(56) References Cited

U.S. PATENT DOCUMENTS

| | | |
|---|---|---|
| 10,692,957 B2 | 6/2020 | Shin et al. |
| 2013/0300952 A1 | 11/2013 | Yeh et al. |
| 2016/0116779 A1 | 4/2016 | Yeh et al. |
| 2019/0067409 A1 | 2/2019 | Shin et al. |

FOREIGN PATENT DOCUMENTS

| | | |
|---|---|---|
| CN | 108470762 A | 8/2018 |
| CN | 109428000 A | 3/2019 |
| CN | 110299470 A | 10/2019 |
| CN | 110970484 A | 4/2020 |
| CN | 111180489 A | 5/2020 |
| CN | 111384069 A | 7/2020 |
| CN | 111769155 A | 10/2020 |
| CN | 108470762 B | 2/2021 |
| EP | 3 451 384 A1 | 3/2019 |

OTHER PUBLICATIONS

Written Opinion of the International Searching Authority dated Sep. 18, 2021 in International Application No. PCT/CN2021/100997, 4 pages.
Notice of Allowance dated Aug. 26, 2022 in Chinese Patent Application No. 202010759902.9, 7 pages.

DISPLAY PANEL AND DISPLAY DEVICE

CROSS REFERENCE

The present disclosure is based upon International Application No. PCT/CN2021/100997 filed on Jun. 18, 2021, which claims priority to Chinese Patent Application No. 202010759902.9, filed on Jul. 31, 2020, entitled "DISPLAY PANEL AND DISPLAY DEVICE", the entire contents of which are incorporated herein by reference in its entirety.

TECHNICAL FIELD

The present disclosure relates to the field of display technology, and in particular, to a display panel and a display device.

BACKGROUND

At present, as for TSP (Touch Sensor Panel), the touch-control structure can be designed by using the FMLOC (Flexible Multi-Layer On Cell) process. The FMLOC process refers to the fabrication of a metal grid electrode layer on the packaging substrate of the display panel for touch control, without external TSP. This process can reduce the thickness of the screen, which is conducive to the fold; at the same time, there is no fit tolerance, which can reduce the width of the frame.

At present, the FMLOC process has been applied on a large scale, but FMLOC touch-control products still face severe challenges such as lack of design experience and low production yield.

SUMMARY

The purpose of the present disclosure is to provide a display panel and a display device.

According to an aspect of the present disclosure, there is provided a display panel, including:

a driving backplane, having a display area and a peripheral area surrounding the display area, wherein the display area is provided with an organic layer, and the peripheral area includes a binding area;

a touch-control layer, disposed in the display area of the driving backplane, and including a first touch-control electrode layer, an insulating layer and a second touch-control electrode layer;

a first inorganic layer, disposed in the binding area of the driving backplane, wherein the first inorganic layer and the insulating layer of the touch-control layer are arranged in an identical layer; and a first organic layer, disposed in the binding area of the driving backplane, and located on a side of the first inorganic layer away from the display area, wherein a projection of the first organic layer on the driving backboard does not overlap with the first inorganic layer; the first organic layer and the organic layer of the display area are arranged in an identical layer.

In an exemplary embodiment of the present disclosure, an edge of the first inorganic layer away from the display area has a convex portion, an edge of the first organic layer close to the display area has a concave portion, the convex portion of the first inorganic layer is located in an area enclosed by the concave portion of the first organic layer, and an interval exists between an edge of the first inorganic layer away from the display area and an edge of the first organic layer close to the display area.

In an exemplary embodiment of the present disclosure, the display panel further includes a first protection layer, the first protection layer is located in the binding area, and the first protection layer covers a side of the first inorganic layer away from the driving backplane, and further dads an edge of the first inorganic layer; a projection of the first protection layer on the driving backplane does not overlap with the first organic layer, and an interval exists between an edge of the first protection layer away from the display area and the edge of the first organic layer close to the display area.

In an exemplary embodiment of the present disclosure, the driving backplane further has a cutting lane surrounding the peripheral area and a dummy pixel area surrounding the cutting lane, the dummy pixel area further includes a test area; the display panel further includes a test unit disposed in the test area, the test unit includes:

a first conductive layer;

a second organic layer, arranged around a periphery of the first conductive layer and covering an edge of the first conductive layer; wherein the second organic layer and the organic layer of the display area are arranged in an identical layer;

a second inorganic layer, covering a side of the second organic layer away from the driving substrate and further cladding an edge of the second organic layer, wherein the second inorganic layer and the insulating layer of the touch-control layer are arranged in an identical layer;

a second conductive layer, disposed on a side of the first conductive layer away from the driving substrate, and located in an area surrounded by the second inorganic layer.

In an exemplary embodiment of the present disclosure, the display panel further includes a second protection layer, the second protection layer is disposed in the test area, and the second protection layer covers a side of the second inorganic layer away from the driving backplane and dads an edge of the second conductive layer.

In an exemplary embodiment of the present disclosure, the display panel further includes:

a third organic layer, disposed in an area of the dummy pixel area of the driving backplane except the test area, wherein an edge of the third organic layer extends along the cutting lane; the third organic layer and the organic layer of the display area are arranged in an identical layer;

a third inorganic layer, disposed in the area of the dummy pixel area of the driving backplane except the test area, wherein an edge of the third inorganic layer extends along the cutting lane; the third inorganic layer covers a side of the third organic layer away from the driving backplane, and the third inorganic layer dads the edge of the third organic layer; the third inorganic layer and the insulating layer of the touch-control layer are arranged in an identical layer.

In an exemplary embodiment of the present disclosure, the display panel further includes a third protection layer, the third protection layer is located in the area of the dummy pixel area except the test area, the third protection layer covers a side of the third inorganic layer away from the driving backplane, and dads the edges of the third organic layer and the third inorganic layer.

In an exemplary embodiment of the present disclosure, the display panel further includes:

a fourth organic layer, disposed in an area of the peripheral area of the driving backplane except the binding area, wherein an edge of the fourth organic layer extends along the cutting lane; the fourth organic layer and the organic layer of the display area are arranged in an identical layer;

a fourth inorganic layer, disposed in the area of the peripheral area of the driving backplane except the binding area, wherein an edge of the fourth inorganic layer extends along the cutting lane; the fourth inorganic layer covers a side of the fourth organic layer away from the driving backplane, and the fourth inorganic layer dads the edge of the fourth organic layer; the fourth inorganic layer and the insulating layer of the touch-control layer are arranged in an identical layer.

In an exemplary embodiment of the present disclosure, the display panel further includes a fourth protection layer, the fourth protection layer is located in an area of the peripheral area except the binding area, the fourth protection layer covers a side of the fourth inorganic layer away from the driving backplane, and dads the edges of the fourth organic layer and the fourth inorganic layer.

In an exemplary embodiment of the present disclosure, the organic layer of the display area includes at least one of a flat layer and a pixel definition layer;

wherein, the first organic layer, the second organic layer, the third organic layer and the fourth organic layer are all arranged in an identical layer with at least one of the flat layer and the pixel definition layer.

In an exemplary embodiment of the present disclosure, the touch-control layer further includes a protection layer covering a side of the second touch-control electrode layer away from the driving backplane, the first protection layer, the second protection layer, the third protection layer and the fourth protection layer are all arranged in an identical layer with the protection layer.

According to another aspect of the present disclosure, there is provided a display device, including the display panels described above.

It should be noted that the above general description and the following detailed description are merely exemplary and exemplary and should not be construed as limiting of the present disclosure.

BRIEF DESCRIPTION OF THE DRAWINGS

The accompanying drawings, which are incorporated in and constitute a part of this specification, illustrate embodiments consistent with the disclosure and serve to explain the principles of the disclosure together with the description. The drawings in the following description are only some embodiments of the present disclosure. For those of ordinary skill in the art, other drawings can also be obtained from these drawings without creative effort.

Figure 1:
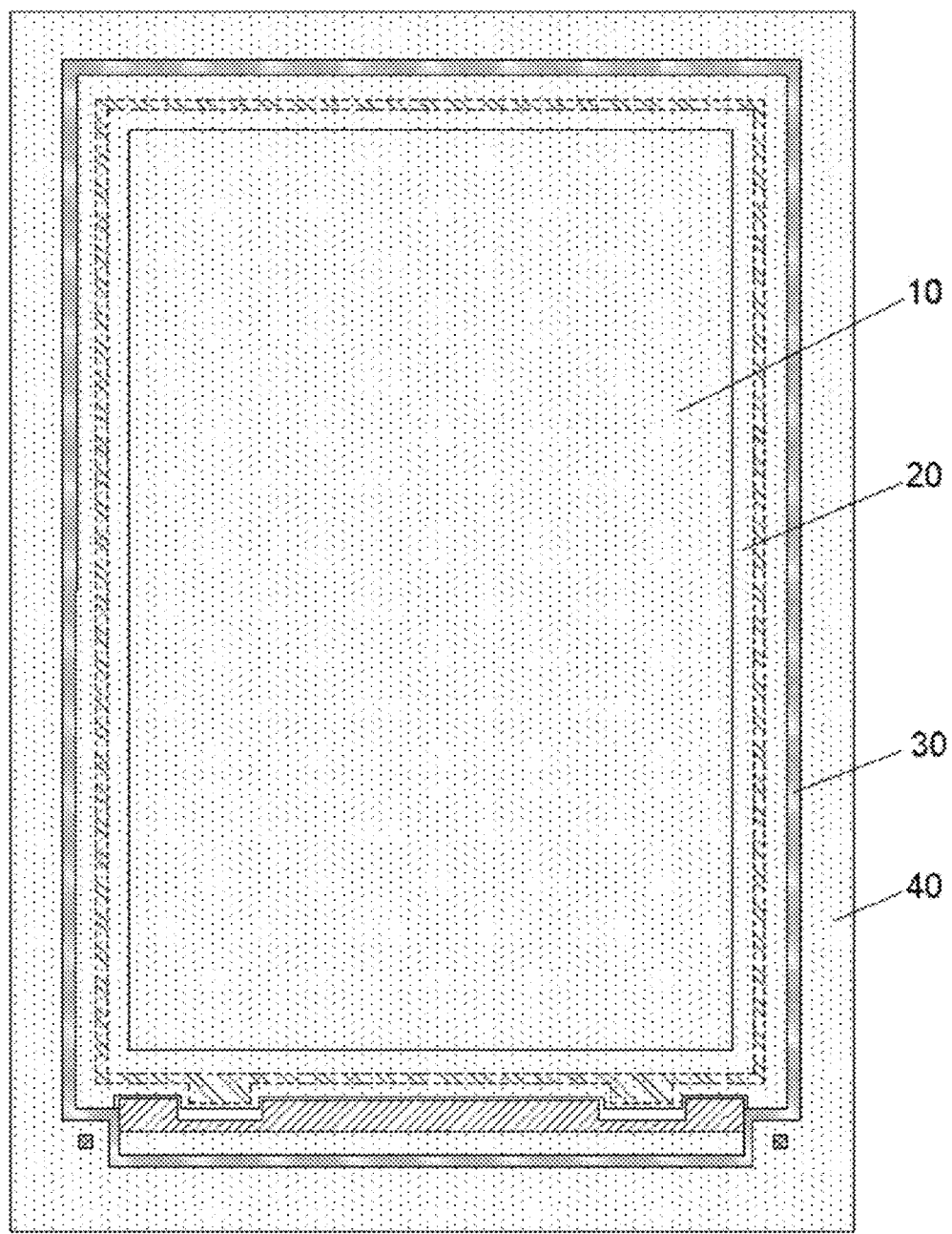
FIG. 1 is a schematic top-view structure diagram of a display panel in an embodiment of the present application.

In the figures: 1, driving backplane; 10, display area; 20, peripheral area; 30, cutting lane; 40, dummy pixel area; 210, binding area; 410, test area;

80, first electrode layer; 81, pixel definition layer; 82, light-emitting layer; 83, second electrode layer; 84, flat layer; 85, first inorganic encapsulation layer; 86, organic encapsulation layer; 87, second inorganic encapsulation layer; 88, first touch-control electrode layer; 89, insulating layer; 90, second touch-control electrode layer; 91, active layer; 92, gate insulating layer; 93, gate layer; 94, dielectric layer; 95, source-drain layer; 96, flat layer; 99, protection layer; 100, substrate;

211, first inorganic layer; 212, first organic layer; 213, first protection layer; 411, first conductive layer; 412, second organic layer; 413, second inorganic layer; 414, second conductive layer; 415, second protection layer; 421, the third inorganic layer; 422, third organic layer; 423, third protection layer; 221, fourth inorganic layer; 222, fourth organic layer; 223, fourth protection layer; 230, touch-control signal line.

DETAILED DESCRIPTION

Example embodiments will now be described more fully with reference to the accompanying drawings. Example embodiments, however, can be embodied in various forms and should not be construed as limited to the embodiments set forth herein; rather, these embodiments are provided so that this disclosure will be thorough and complete, and will fully convey the concept of example embodiments to those skilled in the art. The same reference numerals in the drawings denote the same or similar structures, and thus their detailed descriptions will be omitted. In addition, the drawings are merely schematic illustrations of the present disclosure and are not necessarily drawn to scale.

Although relative terms such as "on" and "under" are used in this specification to describe the relative relationship of one component of an icon to another component, these terms are used in this specification only for convenience, such as according to the directions of the examples in the accompanying drawings. It will be understood that if the device of the icon is turned upside down, the component described as "on" will become the component described as "under". When a certain structure is "on" other structures, it may mean that a certain structure is integrally formed on other structures, or that a certain structure is "directly" arranged on other structures, or that a certain structure is "indirectly" arranged on other structures through another structure.

The terms "a", "an", "the", "said" are used to indicate the presence of one or more elements/components/etc.; the terms "including" and "having" are used to indicate an open-ended inclusive meaning and mean that additional elements/components/etc. may be present in addition to the listed elements/components/etc. The terms "first" "second" and "third" etc. are used only as marks s and are not intended to limit the number of the objects.

In the related art, the binding area of the non-display area of the display panel is used to bind the driving chip, and usually has a complex film layer structure, for example, conductive layers and insulating layers or the like. These layers need to be patterned to form a certain shape, to make the film layer layout more reasonable. Therefore, various organic and inorganic layers need to have stable film layer morphology to ensure good film layer function.

A display panel is provided in the embodiment of the present disclosure. As shown in FIG. 1, the display panel in the embodiment of the present disclosure includes a driving backplane 1. The driving backplane 1 has a display area 10 and a peripheral area 20 surrounding the display area. The display area is provided with an organic layer. The peripheral area 20 includes a binding area 210. The display area 10 of the driving backplane is provided with a touch-control layer. The touch-control layer includes a first touch-control electrode layer 88, an insulating layer 89 and a second touch-control electrode layer 90. A binding area 210 of the driving backplane is provided with a first inorganic layer 211 and a first organic layer 212. The first inorganic layer 211 and the insulating layer 89 of the touch-control layer are disposed in the same layer. The first organic layer 212 is located on the side of the first inorganic layer 211 away from the display area 10. The projection of the first organic layer 212 on the driving backplane 1 does not overlap with the first inorganic layer 211. The first organic layer 212 and the organic layer of the display area are arranged in the same layer. It should be pointed out that "arranged in the same layer/arranged in an identical layer" described in this application means that they are formed with the same material and through the synchronous patterning process.

The first organic layer 212 can be used to cover the circuit traces or the like on the driving backplane, and the film layer is usually thick. The first inorganic layer 211 can be used to cover the touch-control signal lines and the like, and the film layer is usually thin. If the edge of the first inorganic layer 211 overlaps on the edge of the first organic layer 212, since there is a large film break difference and low adhesion between the first inorganic layer 211 and the first organic layer 212 at this position, the first organic layer 212 is deformed due to absorbing water during the water washing process in the preparation process, it will cause deformation of the first inorganic layer 211 attached to the first organic layer 212, and a serious film layer wrinkling problem is likely to occur in this area. In this application, the projections of the first inorganic layer 211 and the first organic layer 212 on the driving backplane do not overlap, that is to say, they do not cover each other, therefore, the first inorganic layer 211 will not be affected by the deformation of the first organic layer 212 due to absorbing water, so as to avoid wrinkles due to deformation of the first organic layer 212. Furthermore, in order to realize the narrow frame design, the lower half of the binding area in the figure needs to be bent. The first organic layer 212 is located on the side of the first inorganic layer 211 away from the display area, and the first organic layer 212 will be bent along with the bending of the binding area. Since the first inorganic layer 211 and the first organic layer 212 do not overlap with each other, the first inorganic layer 211 will not be stretched due to the bending of the first organic layer 212, which further avoids deformation of the first inorganic layer 211. This design prevents wrinkles between the first organic layer 212 and the first inorganic layer 211 in the binding area, which improves the production yield of the FMLOC touch-control products.

The display panel of the embodiment of the present disclosure will be described in detail below.

Figure 2:
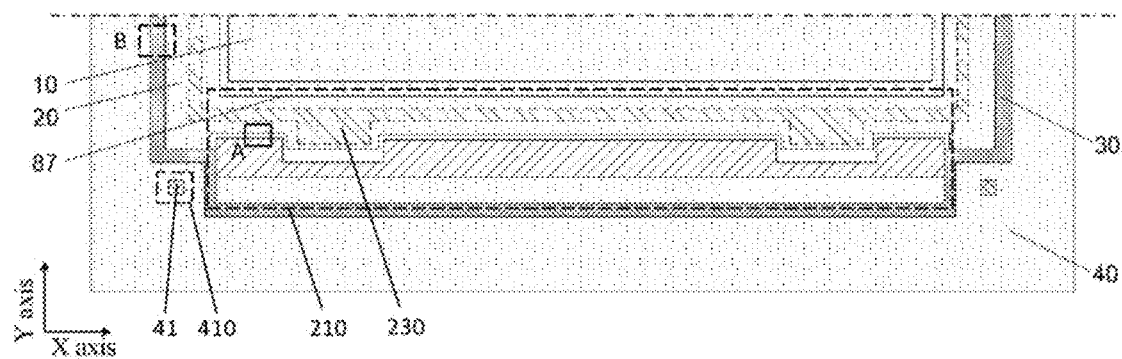
FIG. 2 is the partial enlarged schematic diagram of FIG. 1.

FIG. 1 is a top view of the structure of a display panel in an exemplary embodiment. In the figure, different filling lines indicate different film layers. The display panel includes a display area 10 at the center, a peripheral area 20 surrounding the display area, a cutting lane 30 surrounding the peripheral area, and a dummy pixel area 40 surrounding the cutting lane. The display area 10 is provided with a light-emitting unit and a pixel circuit for driving the light-emitting unit to emit light. The peripheral area 20 is provided with a driving circuit and various signal lines. The cutting lane 30 is the cutting mark line of a single display panel. The dummy pixel area 40 is provided with auxiliary functional structures such as various test signal lines. For the convenience of description, referring to FIG. 2, in this application, the area of the peripheral area below the display area is regarded as the binding area 210. The binding area 210 can be bent to the back of the panel, and connected with the driving chip disposed on the back of the display panel, thereby achieving a narrow frame. It should be noted that the dashed box used to represent the binding area 210 in FIG. 2 is only for brief illustration. In order to clearly show the edge of the binding area, a part of the cutting lane is framed in, but it does not mean that the cutting lane belongs to the binding area.

Figure 3:
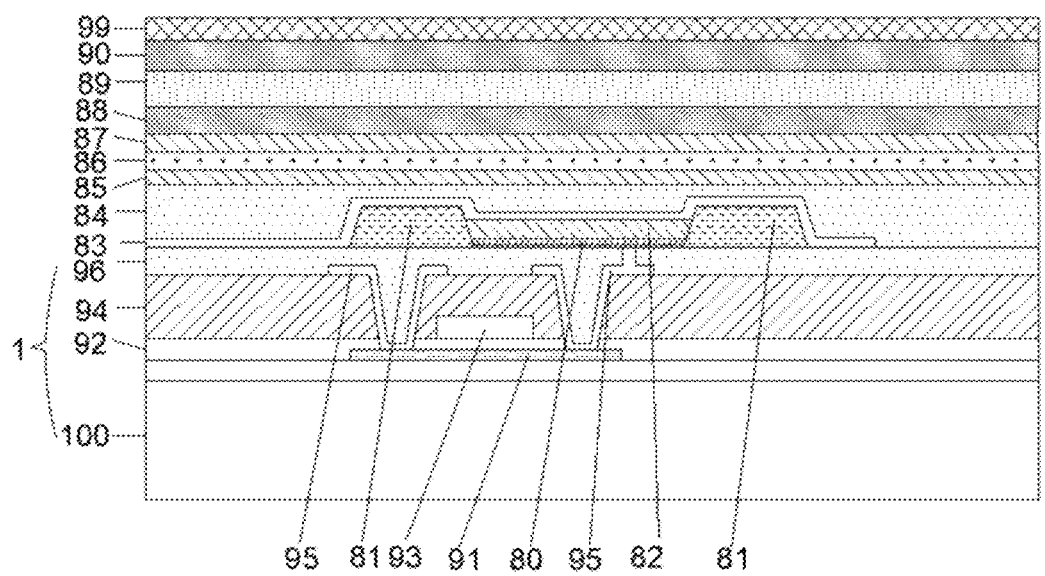
FIG. 3 is a schematic cross-sectional view of a display area of a display panel in an embodiment of the present application.

FIG. 3 shows a schematic cross-sectional view of the display area. A pixel circuit is provided on the driving backplane 1. The pixel circuit includes a driving transistor. Specifically, the driving backplane includes a substrate 100 and a driving transistor located on one side of the substrate 100. For example, the driving transistor includes an active layer 91, a gate insulating layer 92, a gate layer 93, a dielectric layer 94, a source-drain layer 95, a flat layer 96, and the like. It should be noted that the structure of the driving transistor is not limited to this, and may be determined according to actual requirements.

An OLED light-emitting unit is arranged above the driving backplane. FIG. 3 shows the schematic cross-sectional structure of the pixel unit. The OLED light-emitting unit includes a first electrode layer 80, a second electrode layer 83, and a light-emitting layer 82 disposed between the first electrode layer and the second electrode layer. The driving backplane is also provided with a pixel definition layer 81 for defining each sub-pixel. The pixel definition layer 81 has an opening, to expose the first electrode layer 80. The light-emitting layer 82 is arranged in the opening. The second electrode layer 83 can be a whole film layer, covering on the light-emitting layer 82 and the pixel definition layer 81. The first electrode layer 80 is connected to the drain of the driving transistor, and emits light under the driving of the driving transistor. A flat layer 84 may be further disposed above the light-emitting unit. The flat layer 84 is usually made of organic materials, such as acrylic-based polymers, silicon-based polymers, and the like.

An encapsulation layer is arranged above the light-emitting unit to protect the light-emitting unit. The encapsulation layer at least includes an organic encapsulation layer and an inorganic encapsulation layer. The inorganic encapsulation layer plays a main role of blocking water and oxygen intrusion. The organic encapsulation layer plays an auxiliary role of encapsulation and planarization. In the embodiment shown in FIG. 3, the encapsulation layer includes a first inorganic encapsulation layer 85, an organic encapsulation layer 86 and a second inorganic encapsulation layer 87 which are stacked in sequence. The organic encapsulation layer 86 can be made of organic materials such as acrylic-based polymers and silicon-based polymers. Usually, the encapsulation layer extends from the display area to the non-display area. Taking the structure shown in FIG. 2 as an example, the lower boundary of the second inorganic encapsulation layer in the encapsulation layer covers a part of the non-display area.

A touch-control layer is arranged above the encapsulation layer, and the encapsulation layer and the touch-control layer can be bonded together by an adhesive layer. In this exemplary embodiment, referring to FIG. 1, the touch-control layer includes a first touch-control electrode layer 88 and a second touch-control electrode layer 90. One of the touch-control electrode layer may be a metal mesh layer, and the other touch-control electrode layer may be a bridging metal layer. An insulating layer 89 is arranged between the two touch-control electrode layers. A via hole is arranged on the insulating layer 89 to realize the connection between the metal grid and the bridging metal layer, thereby forming a self-capacitance touch-control electrode. In other embodiments, one touch-control electrode layer can be used as an emitter electrode layer, and the other touch-control electrode layer can be used as a sensing electrode layer, and they are separated by an insulating layer to form a mutual capacitive touch-control electrode. The specific structure is not repeated here. Further, the touch-control layer may further include a protection layer 99 covering the side of the second touch-control electrode layer away from the driving backplane. The protection layer 99 can protect the touch-control electrode layer and may be made of an organic material.

Figure 4:
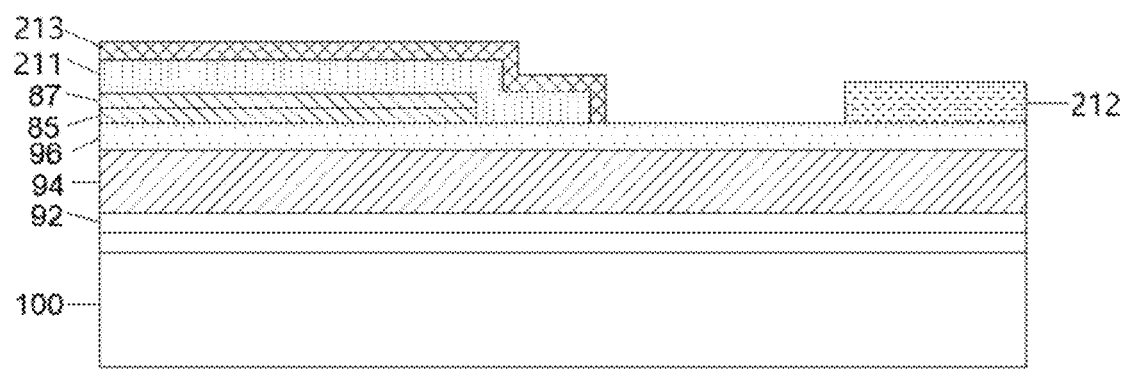
FIG. 4 is a schematic cross-sectional view of a binding area of a display panel in an embodiment of the present application.

The peripheral area is provided with various driving circuits such as light-emitting control circuits and gate driving circuits, as well as various signal lines such as electrode signal lines and touch-control signal lines. For example, as shown in FIG. 1, in an exemplary embodiment, the peripheral area around the display area is provided with touch-control signal lines 230. The touch-control signal lines 230 are respectively converged into two sides of the binding area 210 under the display panel. FIG. 4 is a schematic cross-sectional view of the area A of the binding area 210 in FIG. 2 along the Y axis of the coordinate axis. The binding area 210 is provided with the first inorganic layer 211, which may protect part of the area not covered by the encapsulation layer, to prevent water and oxygen intrusion. The binding area 210 can be bent, and the shape of the edge (lower edge) of the first inorganic layer 211 away from the display area corresponds to the touch-control signal line 230, and has two downward convex portions. The binding area 210 is further provided with a first organic layer 212. The first organic layer 212 is disposed on the side of the first inorganic layer 211 away from the display area. The first organic layer 212 can protect various signal lines below it, and also has a flattening effect. The shape of the edge (upper edge) of the first organic layer 212 close to the display area corresponds to the first inorganic layer 211, and has two concave portions at two ends. The two convex portions of the first inorganic layer 211 are just located in the area enclosed by the two concave portions of the first organic layer 212, but there is an interval between the lower edge of the first inorganic layer 211 and the upper edge of the first organic layer 212. When the edge of the first organic layer 212 is deformed due to absorbing water, it will not affect the first inorganic layer 211. At the same time, the first organic layer 212 will not pull the first inorganic layer 211 when being bent downward.

In this exemplary embodiment, the first inorganic layer 211 and the insulating layer 89 in the touch-control layer of the display area may be disposed in the same layer, so that the first inorganic layer 211 can cover on the inorganic encapsulation layer, and protect part of the binding area not covered by the encapsulation layer. The first organic layer 212 may be disposed in the same layer as the pixel definition layer 81 in the display area, the flat layer 96 of the pixel circuit, or the flat layer 84 on the light-emitting unit, and may include only one film layer, such as the pixel definition layer 81 shown in FIG. 4, or it can also contain a plurality of film layers at the same time. In other embodiments, the first organic layer 212 may also be other organic film layers, which are formed simultaneously with the film layers of the corresponding same material of the display area.

Further, a first protection layer 213 is further disposed on the first inorganic layer 211 for protecting the first inorganic layer 211. Referring to FIG. 4, the first protection layer 213 is also located in the binding area. The first protection layer 213 covers the side of the first inorganic layer 211 away from the driving backplane, and also dads the edge of the first inorganic layer. The shape of the first protection layer 213 is similar to that of the first inorganic layer 211. The projection of the first protection layer 213 on the driving backplane does not overlap with the first organic layer 212, and there is an interval between the edge (lower edge) of the first protection layer 213 away from the display area and the edge (upper edge) of the first organic layer 212 close to the display area. The first protection layer 213 and the first inorganic layer 211 will not be affected when the first organic layer 212 is bent. The first protection layer 213 and the protection layer 99 in the touch-control layer can be disposed in the same layer. Since the film is formed in the last step, no water washing process will be performed, the problem of wrinkles between the film layers caused by the uppermost first protective layer 213 absorbing water will not occur.

Figure 5:
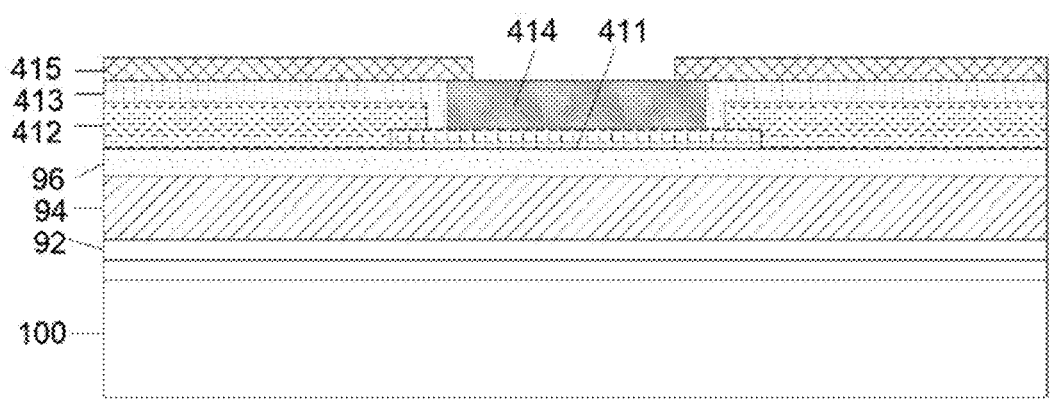
FIG. 5 is a schematic cross-sectional view of a testing unit of a display panel in an embodiment of the present application.

In an exemplary embodiment, as shown in FIG. 2, the dummy pixel area 40 further includes a test area 410. The display panel further includes a test unit 41 disposed in the test area. The test unit 41 is used to test the electrical performance of the display panel, and disposed below the display panel. As shown in FIG. 5, it is a schematic cross-sectional view of the test area 410 in FIG. 2 in the X-axis direction. The test unit 41 includes a first conductive layer 411, a second organic layer 412, a second inorganic layer 413 and a second conductive layer 414. The second organic layer 412 is arranged around the periphery of the first conductive layer 411 and covers the edge of the first conductive layer 411. The second inorganic layer 413 covers the side of the second organic layer 412 away from the driving substrate and also covers the edge of the second organic layer 412. The second conductive layer 414 is disposed on the side of the first conductive layer 411 away from the driving substrate, and is located in the area surrounded by the second inorganic layer 413.

The first conductive layer 411 and the second conductive layer 414 are used to realize electrical connection, to realize the electrical performance test. The first conductive layer 411 can be disposed in the same layer as the first electrode layer or the second electrode layer in the display area. The second conductive layer 414 can be disposed in the same layer as the second touch-control electrode layer in the touch-control layer. In this embodiment, the first conductive layer 411 and the second conductive layer 414 are both square. The second organic layer 412 covers surrounding edges of the first conductive layer 411 and plays the role of insulation and protection. The second inorganic layer 413 covers surrounding edges of the second organic layer 412 to prevent water vapor from entering the second organic layer 412, and avoid forming wrinkles between the film layers after the water washing process. Similar to the first organic layer, the second organic layer 412 may also be disposed in the same layer as the pixel definition layer 81 or the flat layer 84 in the display area, and may include one film layer or a plurality of film layers. Similar to the first inorganic layer, the second inorganic layer 413 can also be disposed in the same layer as the insulating layer in the touch-control layer in the display area. Therefore, the formation sequence of the four film layers of the test unit is the first conductive layer 411, the second organic layer 412, the second conductive layer 414, and the second inorganic layer 413. Further, a second protection layer 415 may be provided on the side of the second inorganic layer 413 away from the driving backplane, so as to protect the second inorganic layer 413. At the same time, the second protection layer 415 further dads the edge of the second conductive layer 414 to play the role of insulation and protection. The second protection layer 415 can also be arranged in the same layer as the protection layer 99 in the touch-control layer. Since the film layer is formed in the last step and no water washing process will be performed, the problem of wrinkles between the film layers caused by the uppermost second protective layer 415 absorbing water will not occur, which ensures the stability of the film layer structure and performance of the binding area.

Figure 6:
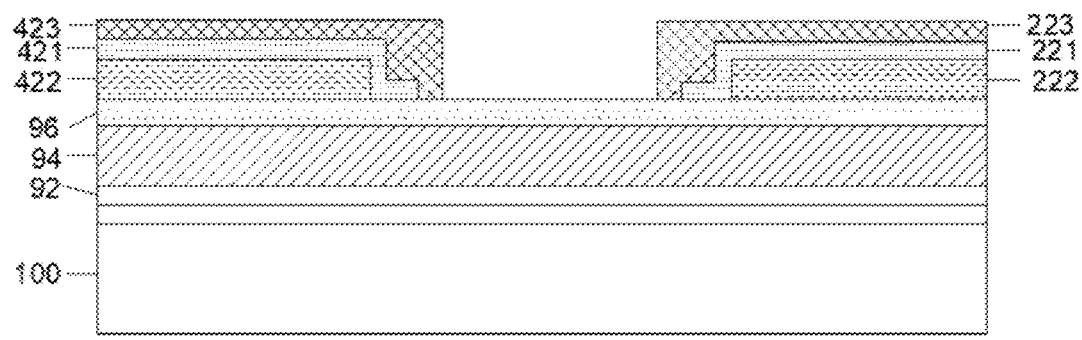
FIG. 6 is a schematic cross-sectional view of a cutting lane of a display panel according to an embodiment of the present application.

In an exemplary embodiment, referring to FIG. 2 and FIG. 6, FIG. 6 is a schematic cross-sectional view of the area B in FIG. 2 along the X-axis direction. The display panel further includes a third organic layer 422. The third organic layer 422 is provided in an area of the dummy pixel area 40 of the driving backplane except the test area 410, i.e., the area around the cutting lane 30 except the test area 410. An edge of the third organic layer extends along the cutting lane 30 (i.e., outside the cutting lane). The display panel further includes a third inorganic layer 421. The third inorganic layer 421 is also disposed in the area of the dummy pixel area of the driving backplane except the test area. An edge of the third inorganic layer 421 extends along the cutting lane 30. The third inorganic layer 421 covers a side of the third organic layer 422 away from the driving backplane, and the third inorganic layer 421 dads the edge of the third organic layer 422, which can prevent water vapor from entering the third organic layer 422 and avoid forming wrinkles between the film layers after the water washing process, which ensures the stability of the film layer structure and test performance of the test unit.

Similar to the first organic layer 212, the third organic layer 422 may also be disposed in the same layer as the pixel definition layer 81 or the flat layer 84 in the display area, and may include one film layer or a plurality of film layers. Similar to the first inorganic layer 211, the third inorganic layer 421 can also be disposed in the same layer as the insulating layer 89 in the touch-control layer of the display area.

Further, a third protection layer 423 may also be provided on the side of the third inorganic layer 421 away from the driving backplane. The third protection layer 423 is located in the area of the dummy pixel area except the test area. The third protection layer 423 dads edges of the third organic layer 422 and the third inorganic layer 421, to protect the two film layers. The third protection layer 423 can also be arranged in the same layer as the protection layer in the touch-control layer. Since the film is formed in the last step, no water washing process will be performed, the problem of wrinkles between the film layers caused by the uppermost third protection layer 423 absorbing water will not occur, which ensures the stability of the film layer structure in the dummy pixel area and avoids affecting the performance test of the panel.

In an exemplary embodiment, as shown in the figure, the display panel further includes a fourth organic layer 222. The fourth organic layer 222 is disposed in the area of the peripheral area of the driving backplane except the binding area, which can be understood as areas in directions of upper, left and right of the outer periphery of the display area. The edge of the fourth organic layer 222 extends along the cutting lane 30 (i.e., the inner side of the cutting lane). The display panel further includes a fourth inorganic layer 221. The fourth inorganic layer 221 is disposed in the area of the peripheral area 20 of the driving backplane except the binding area 210. An edge of the fourth inorganic layer 221 extends along the cutting lane 30. The fourth inorganic layer 221 covers a side of the fourth organic layer 222 away from the driving backplane. The fourth inorganic layer 221 dads the edge of the fourth organic layer 222, which can prevent water vapor from entering the fourth organic layer 222, avoid forming wrinkles between the film layers after the water washing process, improve the stability of the film layer during cutting, and ensure that the cut display panel has a stable structure.

Similar to the first organic layer 212, the fourth organic layer 222 may also be disposed in the same layer as the pixel definition layer 81 or the flat layer 84 in the display area, and may include one film layer or a plurality of film layers. Similar to the first inorganic layer 211, the fourth inorganic layer 221 can also be provided in the same layer as the insulating layer 89 in the touch-control layer of the display area.

Further, the display panel further includes a fourth protection layer 223. The fourth protection layer 223 is located in an area of the peripheral area 20 except the binding area. The fourth protection layer covers a side of the fourth inorganic layer 221 away from the driving backplane, and dads the edges of the fourth organic layer 222 and the fourth inorganic layer 221, to protect the two film layers. The fourth protection layer 223 can also be arranged in the same layer as the protection layer 99 in the touch-control layer. Since the film layer is formed in the last step and no water washing process will be performed, the problem of wrinkles between the film layers caused by the uppermost fourth protection layer 223 absorbing water will not occur.

In the above-mentioned embodiments, taking the drawings as examples, the first to fourth inorganic layers, the first to fourth organic layers and other film layers are all formed on the driving backplane 1, so there are the same film layer structures as the display area therebelow. These film layers can be formed synchronously with the corresponding film layers in the display area during the preparation, which will not be repeated herein.

The display panel of this embodiment improves the problem of wrinkles between the film layers by optimizing the film layer structure in different areas, which improves the product yield of the entire display panel as a whole and ensures an ideal display effect.

Embodiments of the present disclosure further provide a display device including the display panel in the above embodiments. Since the display panel has good film structure stability, the performance of the display device is stable.

This disclosure does not specifically limit the application of the display device, which can be any product or component with a display function, such as a TV, a notebook computer, a tablet computer, a wearable display device, a mobile phone, an on-board monitor, a navigation, an e-book, a digital photo frame, an advertising light box, etc.

Other embodiments of the present disclosure will readily occur to those skilled in the art upon consideration of the specification and practice of the disclosure disclosed herein. This disclosure is intended to cover any variations, uses, or adaptations of this disclosure that follow the general principles of this disclosure and include common general knowledge or conventional technical means in the technical field not disclosed by this disclosure. The specification and embodiments are to be regarded as exemplary only, with the true scope and spirit of the disclosure being indicated by the appended claims.

What is claimed is:
1. A display panel, comprising:
a driving backplane, having a display area and a peripheral area surrounding the display area, wherein the display area is provided with an organic layer, and the peripheral area comprises a binding area;

a touch-control layer, disposed in the display area of the driving backplane, and comprising a first touch-control electrode layer, an insulating layer and a second touch-control layer;

a first inorganic layer, disposed in the binding area of the driving backplane, wherein the first inorganic layer and the insulating layer of the touch-control layer are arranged in an identical layer; and a first organic layer, disposed in the binding area of the driving backplane, and located on a side of the first inorganic layer away from the display area, wherein a projection of the first organic layer on the driving backboard does not overlap with the first inorganic layer; the first organic layer and the organic layer of the display area are arranged in an identical layer.

2. The display panel according to claim 1, wherein an edge of the first inorganic layer away from the display area has a convex portion, an edge of the first organic layer close to the display area has a concave portion, the convex portion of the first inorganic layer is located in an area enclosed by the concave portion of the first organic layer, and an interval exists between an edge of the first inorganic layer away from the display area and an edge of the first organic layer close to the display area.

3. The display panel according to claim 2, wherein the display panel further comprises a first protection layer, the first protection layer is located in the binding area, and the first protection layer covers a side of the first inorganic layer away from the driving backplane, and further dads an edge of the first inorganic layer; a projection of the first protection layer on the driving backplane does not overlap with the first organic layer, and an interval exists between an edge of the first protection layer away from the display area and the edge of the first organic layer close to the display area.

4. The display panel according to claim 3, wherein the driving backplane further has a cutting lane surrounding the peripheral area and a dummy pixel area surrounding the cutting lane, the dummy pixel area further comprises a test area; the display panel further comprises a test unit disposed in the test area, the test unit comprises:
    a first conductive layer;
    a second organic layer, arranged around a periphery of the first conductive layer and covering an edge of the first conductive layer; wherein the second organic layer and the organic layer of the display area are arranged in an identical layer;
    a second inorganic layer, covering a side of the second organic layer away from the driving substrate and further cladding an edge of the second organic layer, wherein the second inorganic layer and the insulating layer of the touch-control layer are arranged in an identical layer;
    a second conductive layer, disposed on a side of the first conductive layer away from the driving substrate, and located in an area surrounded by the second inorganic layer.

5. The display panel according to claim 4, wherein the display panel further comprises a second protection layer, the second protection layer is disposed in the test area, and the second protection layer covers a side of the second inorganic layer away from the driving backplane and dads an edge of the second conductive layer.

6. The display panel according to claim 5, further comprising:
    a third organic layer, disposed in an area of the dummy pixel area of the driving backplane except the test area, wherein an edge of the third organic layer extends along the cutting lane; the third organic layer and the organic layer of the display area are arranged in an identical layer;
    a third inorganic layer, disposed in the area of the dummy pixel area of the driving backplane except the test area, wherein an edge of the third inorganic layer extends along the cutting lane; the third inorganic layer covers a side of the third organic layer away from the driving backplane, and the third inorganic layer dads the edge of the third organic layer; the third inorganic layer and the insulating layer of the touch-control layer are arranged in an identical layer.

7. The display panel according to claim 6, wherein the display panel further comprises a third protection layer, the third protection layer is located in the area of the dummy pixel area except the test area, the third protection layer covers a side of the third inorganic layer away from the driving backplane, and dads the edges of the third organic layer and the third inorganic layer.

8. The display panel according to claim 7, further comprising:
    a fourth organic layer, disposed in an area of the peripheral area of the driving backplane except the binding area, wherein an edge of the fourth organic layer extends along the cutting lane; the fourth organic layer and the organic layer of the display area are arranged in an identical layer;
    a fourth inorganic layer, disposed in the area of the peripheral area of the driving backplane except the binding area, wherein an edge of the fourth inorganic layer extends along the cutting lane; the fourth inorganic layer covers a side of the fourth organic layer away from the driving backplane, and the fourth inorganic layer dads the edge of the fourth organic layer; the fourth inorganic layer and the insulating layer of the touch-control layer are arranged in an identical layer.

9. The display panel according to claim 8, wherein the display panel further comprises a fourth protection layer, the fourth protection layer is located in an area of the peripheral area except the binding area, the fourth protection layer covers a side of the fourth inorganic layer away from the driving backplane, and dads the edges of the fourth organic layer and the fourth inorganic layer.

10. The display panel according to claim 8, wherein the organic layer of the display area comprises at least one of a flat layer and a pixel definition layer;
    wherein, the first organic layer, the second organic layer, the third organic layer and the fourth organic layer are all arranged in an identical layer with at least one of the flat layer and the pixel definition layer.

11. The display panel according to claim 9, wherein the touch-control layer further comprises a protection layer covering a side of the second touch-control electrode layer away from the driving backplane, the first protection layer, the second protection layer, the third protection layer and the fourth protection layer are all arranged in an identical layer with the protection layer.

12. A display device, comprising a display panel, wherein the display panel comprises:
    a driving backplane, having a display area and a peripheral area surrounding the display area, wherein the display area is provided with an organic layer, and the peripheral area comprises a binding area;
    a touch-control layer, disposed in the display area of the driving backplane, and comprising a first touch-control electrode layer, an insulating layer and a second touch-control electrode layer;

a first inorganic layer, disposed in the binding area of the driving backplane, wherein the first inorganic layer and the insulating layer of the touch-control layer are arranged in an identical layer; and a first organic layer, disposed in the binding area of the driving backplane, and located on a side of the first inorganic layer away from the display area, wherein a projection of the first organic layer on the driving backboard does not overlap with the first inorganic layer; the first organic layer and the organic layer of the display area are arranged in an identical layer.

13. The display device according to claim 12, wherein an edge of the first inorganic layer away from the display area has a convex portion, an edge of the first organic layer close to the display area has a concave portion, the convex portion of the first inorganic layer is located in an area enclosed by the concave portion of the first organic layer, and an interval exists between an edge of the first inorganic layer away from the display area and an edge of the first organic layer close to the display area.

14. The display device according to claim 13, wherein the display panel further comprises a first protection layer, the first protection layer is located in the binding area, and the first protection layer covers a side of the first inorganic layer away from the driving backplane, and further dads an edge of the first inorganic layer; a projection of the first protection layer on the driving backplane does not overlap with the first organic layer, and an interval exists between an edge of the first protection layer away from the display area and the edge of the first organic layer close to the display area.

15. The display device according to claim 14, wherein the driving backplane further has a cutting lane surrounding the peripheral area and a dummy pixel area surrounding the cutting lane, the dummy pixel area further comprises a test area; the display panel further comprises a test unit disposed in the test area, the test unit comprises:

a first conductive layer;

a second organic layer, arranged around a periphery of the first conductive layer and covering an edge of the first conductive layer; wherein the second organic layer and the organic layer of the display area are arranged in an identical layer;

a second inorganic layer, covering a side of the second organic layer away from the driving substrate and further cladding an edge of the second organic layer, wherein the second inorganic layer and the insulating layer of the touch-control layer are arranged in an identical layer;

a second conductive layer, disposed on a side of the first conductive layer away from the driving substrate, and located in an area surrounded by the second inorganic layer.

16. The display device according to claim 15, wherein the display panel further comprises a second protection layer, the second protection layer is disposed in the test area, and the second protection layer covers a side of the second inorganic layer away from the driving backplane and dads an edge of the second conductive layer.

17. The display device according to claim 16, wherein the display panel further comprises:

a third organic layer, disposed in an area of the dummy pixel area of the driving backplane except the test area, wherein an edge of the third organic layer extends along the cutting lane; the third organic layer and the organic layer of the display area are arranged in an identical layer;

a third inorganic layer, disposed in the area of the dummy pixel area of the driving backplane except the test area, wherein an edge of the third inorganic layer extends along the cutting lane; the third inorganic layer covers a side of the third organic layer away from the driving backplane, and the third inorganic layer dads the edge of the third organic layer; the third inorganic layer and the insulating layer of the touch-control layer are arranged in an identical layer.

18. The display device according to claim 17, wherein the display panel further comprises a third protection layer, the third protection layer is located in the area of the dummy pixel area except the test area, the third protection layer covers a side of the third inorganic layer away from the driving backplane, and dads the edges of the third organic layer and the third inorganic layer.

19. The display device according to claim 18, wherein the display panel further comprises:

a fourth organic layer, disposed in an area of the peripheral area of the driving backplane except the binding area, wherein an edge of the fourth organic layer extends along the cutting lane; the fourth organic layer and the organic layer of the display area are arranged in an identical layer;

a fourth inorganic layer, disposed in the area of the peripheral area of the driving backplane except the binding area, wherein an edge of the fourth inorganic layer extends along the cutting lane; the fourth inorganic layer covers a side of the fourth organic layer away from the driving backplane, and the fourth inorganic layer dads the edge of the fourth organic layer; the fourth inorganic layer and the insulating layer of the touch-control layer are arranged in an identical layer.

20. The display device according to claim 19, wherein the display panel further comprises a fourth protection layer, the fourth protection layer is located in an area of the peripheral area except the binding area, the fourth protection layer covers a side of the fourth inorganic layer away from the driving backplane, and dads the edges of the fourth organic layer and the fourth inorganic layer.

* * * * *